(12) United States Patent
Hayashi et al.

(10) Patent No.: US 7,553,756 B2
(45) Date of Patent: Jun. 30, 2009

(54) PROCESS FOR PRODUCING SEMICONDUCTOR INTEGRATED CIRCUIT DEVICE

(75) Inventors: Hiroyuki Hayashi, Ome (JP); Takayuki Oshima, Ome (JP); Hideo Aoki, Musashimurayama (JP)

(73) Assignee: Hitachi, Ltd., Tokyo (JP)

( * ) Notice: Subject to any disclaimer, the term of this patent is extended or adjusted under 35 U.S.C. 154(b) by 414 days.

(21) Appl. No.: 11/598,084

(22) Filed: Nov. 13, 2006

(65) Prior Publication Data

US 2007/0111508 A1 May 17, 2007

(30) Foreign Application Priority Data

Nov. 16, 2005 (JP) .............................. 2005-331020

(51) Int. Cl.
*H01L 21/4763* (2006.01)
(52) U.S. Cl. .................. 438/622; 438/319; 438/411; 438/421; 257/522; 257/E21.573
(58) Field of Classification Search ................ 438/319, 438/411–413, 421–422, 619, 622, 623, 584, 438/597, 618, 624; 257/522, E21.573
See application file for complete search history.

(56) References Cited

U.S. PATENT DOCUMENTS

| | | | | |
|---|---|---|---|---|
| 6,093,633 | A * | 7/2000 | Matsumoto | 438/622 |
| 6,159,845 | A * | 12/2000 | Yew et al. | 438/637 |
| 6,211,561 | B1 * | 4/2001 | Zhao | 257/522 |
| 6,252,290 | B1 * | 6/2001 | Quek et al. | 257/522 |
| 6,576,550 | B1 * | 6/2003 | Brase et al. | 438/687 |
| 6,890,828 | B2 * | 5/2005 | Horak et al. | 438/319 |
| 7,056,822 | B1 * | 6/2006 | Zhao | 438/619 |
| 7,253,095 | B2 * | 8/2007 | Lur et al. | 438/619 |
| 7,449,407 | B2 * | 11/2008 | Lur et al. | 438/619 |
| 2004/0232552 | A1 * | 11/2004 | Wang et al. | 257/758 |
| 2005/0037604 | A1 * | 2/2005 | Babich et al. | 438/619 |

* cited by examiner

*Primary Examiner*—W. David Coleman
*Assistant Examiner*—Su C Kim
(74) *Attorney, Agent, or Firm*—Miles & Stockbridge P.C.

(57) ABSTRACT

An object of the present invention is to prevent formation of a badly situated via metal in a Damascene wiring portion in multiple layers having an air-gap structure. In the present invention, a via is completely separated from an air-gap 45 by forming an interlayer insulating film 44 having the air-gap 45 between adjacent Damascene wiring portions after forming a sacrifice film pillar 42 from a selectively removable insulating film in a formation region of a connection hole. The present invention can provide multiple-layered buried wiring in which a high reliable via connection and a reduced parasitic capacitance due to the air-gap are achieved.

20 Claims, 15 Drawing Sheets

PROCESS FOR PRODUCING SEMICONDUCTOR INTEGRATED CIRCUIT DEVICE

INCORPORATION BY REFERENCE

The present application claims priority from Japanese application JP2005-331020 filed on Nov. 16, 2005, the content of which is hereby incorporated by reference into this application.

BACKGROUND OF THE INVENTION

1. Field of the Invention

The present invention relates to a method for producing a semiconductor integrated circuit device, especially to a method for producing a semiconductor integrated circuit device having multi-layered buried wiring.

2. Description of Related Art

A structure of buried wiring is formed in a manner that wiring material is buried in an aperture for wiring such as a wiring groove or connection hole formed in an insulating film by wiring formation technologies as called Damascene Technologies (Single-Damascene Technology and Dual-Damascene Technology).

Recently, an increase in integration of the semiconductor integrated circuit device has reduced a clearance between such buried wiring lines. This increases such parasitic capacitance to cause a signal delay. Therefore, it may be desired to reduce the parasitic capacitance between wirings.

In U.S. Pat. No. 6,159,845 (hereinafter, referred to as "Patent"), a technique to form an air-gap between buried wiring lines is disclosed. FIGS. 1A to 1E in this Patent illustrate a method for producing one layer having buried wiring in the order of process steps. The technique shown may be characterized by reduced parasitic capacitance between adjacent buried wiring lines, because an insulating film intervening between adjacent buried wiring lines includes an air-gap.

In the Patent, a method for fabricating multi-layered buried wiring having an air-gap structure is not explicitly stated. From considerations conducted by the present inventors, it has been found that when the multi-layered buried wiring is formed using the technique described in the Patent, there may be problems of an increase in resistance of a via portion due to a defectively buried metal in the via portion, or parasitic capacitance that cannot be reduced between adjacent buried wiring lines because of metal films formed in the air-gap. This is because, as shown in FIG. 2, misalignment during a typical photolithographic process between underlying buried wiring portions 65 (single Damascene wiring) and the via portions 66 in the overlying buried wiring portions 68 (dual Damascene wiring) brings the via portions 66 into contact with an air-gap 67 formed between the underlying buried wiring portions 65: this causes a metal intrusion 69 in the air-gap 67 or a defectively buried metal 70 in the via portion when metal film is formed in the overlying buried wiring portion 68 including the via portion 66.

BRIEF SUMMARY OF THE INVENTION

According to the present invention herein disclosed, representative embodiments will be summarized as follows.

A process for producing a semiconductor integrated circuit device according to the present invention includes the following steps of:

(a) providing a first insulating film over a semiconductor substrate;

(b) providing a plurality of wiring grooves in the first insulating film;

(c) forming a first conductive film on the first insulating film including respective insides of the plurality of the wiring grooves;

(d) removing the first conductive film lying outside the plurality of the wiring grooves to form a wiring line composed of the first conductive film in respective insides of the plurality of the wiring grooves;

(e) forming a second insulating film from material different than that of the first insulating film on the first insulating film and the wiring line;

(f) etching the second insulating film by using a mask covering a formation region of a connection hole to be formed in a later step for exposing the upper surface of the wiring line, to form a sacrifice film pillar composed of the second insulating film in the formation region of the connection hole;

(g) selectively removing the first insulating film in a region not covered with the sacrifice film pillar to leave behind the first insulating film under the sacrifice film pillar;

(h) forming a third insulating film from material different than that of the second insulating film on the wiring line and sacrifice film pillar, while leaving behind an air-gap in a space region between the wiring line portions on which the first insulating film was removed;

(i) removing the third insulating film on the sacrifice film pillar to expose the upper surface of the sacrifice film pillar;

(j) removing the sacrifice film pillar to form the connection hole for exposing the upper surface of the wiring line; and (k) forming a second conductive film inside the connection hole.

A process for producing a semiconductor integrated circuit device according to the present invention includes the following steps of:

(a) providing a first insulating film over a semiconductor substrate;

(b) removing a part of the first insulating film to form a plurality of first wiring grooves for a first Damascene wiring portion to be formed in a later step;

(c) forming a first conductive film on the first insulating film including respective insides of the plurality of the first wiring grooves;

(d) removing the first conductive film lying outside the plurality of the first wiring grooves to form the first Damascene wiring portion composed of the first conductive film in respective insides of the plurality of the first wiring grooves;

(e) forming a second insulating film from material different than that of the first insulating film on the first insulating film and the first Damascene wiring portion;

(f) etching the second insulating film using a mask covering a formation region of a plurality of connection holes to be formed in a later step for a via portion of a second Damascene wiring portion to form a plurality of sacrifice film pillars composed of the second insulating film in the formation region of the plurality of the connection holes;

(g) selectively removing the first insulating film in a region not covered with the sacrifice film pillars to leave behind the first insulating film under the sacrifice film pillars;

(h) forming a third insulating film from material different than that of the second insulating film on the wiring portion and the sacrifice film pillars, while leaving behind an air-gap in a space region between the wiring portions on which the first insulating film was removed;

(i) removing the third insulating film on the sacrifice film pillars to expose the upper surface of the plurality of the sacrifice film pillars;

(j) removing a part of the third insulating film and the top of the plurality of the sacrifice film pillars to form a plurality of second wiring grooves for wiring of the second Damascene wiring portion to be formed in a later step;

(k) removing the bottom of the plurality of the sacrifice film pillars to form the plurality of the connection holes;

(l) forming a second conductive film on the third insulating film including respective insides of the plurality of the second wiring grooves and the plurality of the connection holes; and (m) removing the second conductive film lying outside the plurality of the second wiring grooves and the plurality of the connection holes to form the second Damascene wiring portion composed of the second conductive film in respective insides of the plurality of the first wiring grooves and the plurality of the connection holes.

According to the present invention herein disclosed, advantages achieved by the representative embodiments will be summarized as follows.

The present invention can provide a buried wiring portion in multiple layers having high reliable via connection and reduced parasitic capacitance due to an air-gap.

Other objects, features and advantages of the invention will become apparent from the following description of the embodiments of the invention taken in conjunction with the accompanying drawings.

DESCRIPTION OF REFERENCE NUMERALS

Figure 1:
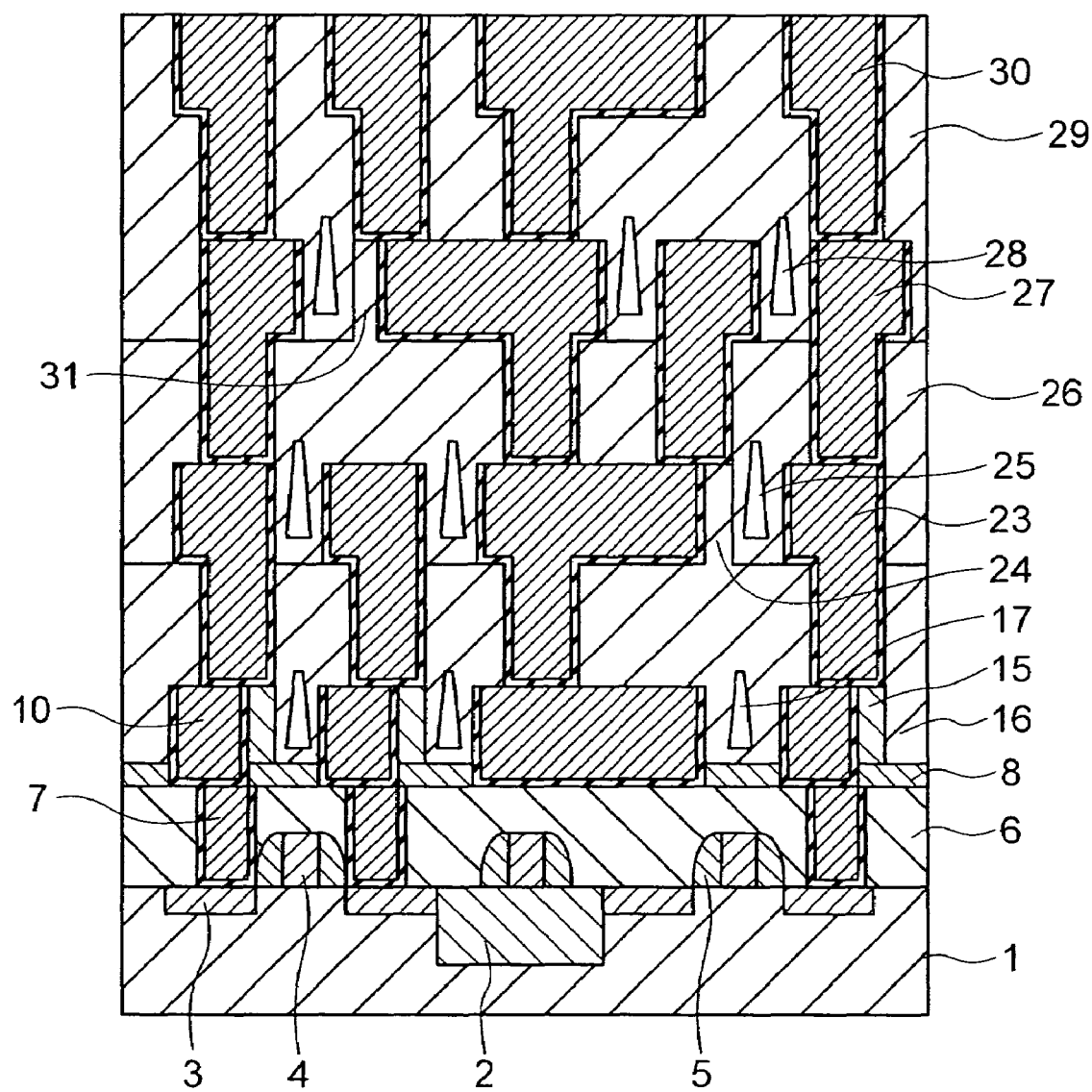
FIG. 1 is a longitudinal sectional view of a substantial portion of a semiconductor device of an example 1 of the present invention.
Figure 2:
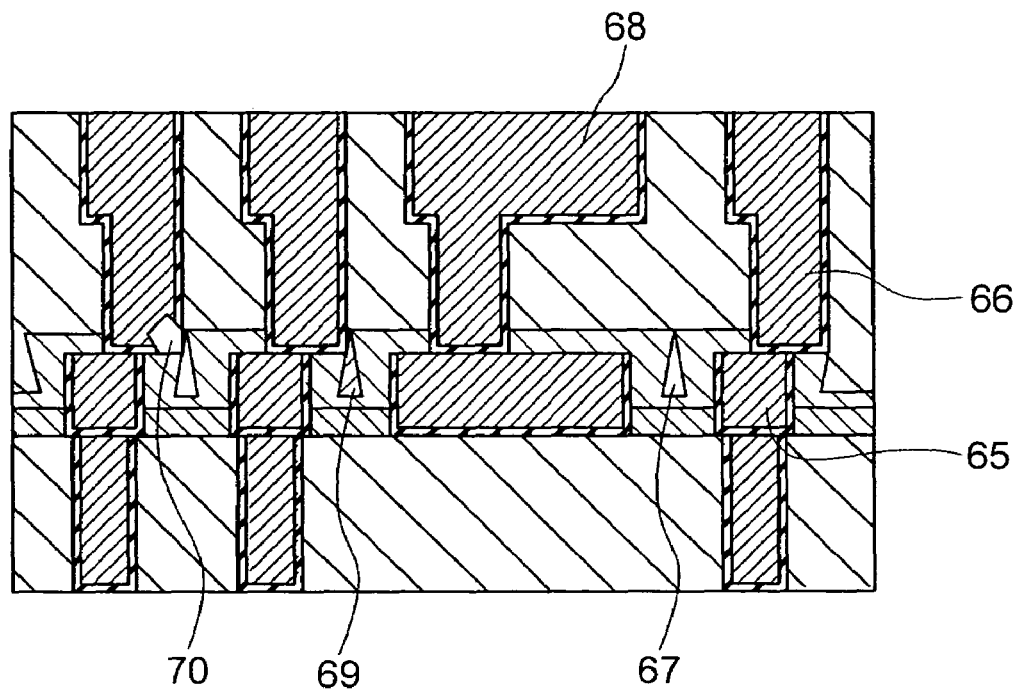
FIG. 2 is a longitudinal sectional view illustrating issues of a buried wiring portion in multiple layers having a conventional air-gap structure.

1 . . . Semiconductor substrate
2 . . . Field insulating film
3 . . . Diffusion layer, Source region and drain region
4 . . . Gate electrode
5 . . . Side wall insulating film
6 . . . Interlayer insulating film 7 . . . Plug
8 . . . SiCN/SiC film
9 . . . FSG film, Insulating film
10 . . . Laminated single Damascene wiring portion, Single Damascene wiring portion
11 . . . SiLK film
12 . . . P-TEOS film
13 . . . Convex resist, Resist
14 . . . Sacrifice film pillar
15 . . . Partial film, FSG film
16 . . . Interlayer insulating film, FSG film
17 . . . Air-gap
18 . . . Interlayer insulating film
20 . . . Resist pattern, Resist
21 . . . Groove
22 . . . Connection hole
23 . . . Dual Damascene wiring portion
24 . . . Partial film of the interlayer insulating film 16
25 . . . Air-gap
26 . . . Interlayer insulating film
27 . . . Dual Damascene wiring portion
28 . . . Air-gap
29 . . . Interlayer insulating film
30 . . . Dual Damascene wiring portion
31 . . . Partial film of the interlayer insulating film 26
32 . . . CoWB alloyed film
33 . . . CoWB alloyed film
34 . . . Under part of the sacrifice film pillar
35 . . . Groove
36 . . . Connection hole
37 . . . P-SiN film
38 . . . SiN hard mask
39 . . . SiLK film
40 . . . P-TEOS film
41 . . . Convex resist, Resist
42 . . . Sacrifice film pillar
43 . . . Partial film of the insulating film, FSG film
44 . . . Interlayer insulating film
45 . . . Air-gap
46 . . . Via
47 . . . SiCN/SiC film
48 . . . FSG film
49 . . . Single Damascene wiring portion
50 . . . Interlayer insulating film
51 . . . CoWB alloyed film
52 . . . CoWB alloyed film
53 . . . Insulating film
54 . . . Interlayer insulating film
55 . . . Air-gap
56 . . . Via
57 . . . SiCN/SiC film
58 . . . FSG film
59 . . . Single Damascene wiring portion
60 . . . Sacrifice film pillar
61 . . . SiC film
62 . . . Porous SiOC film
63 . . . Air-gap
64 . . . Via
65 . . . Underlying buried wiring portion (single Damascene wiring portion)
66 . . . Via portion
67 . . . Air-gap

DETAILED DESCRIPTION OF THE INVENTION

Now, the present invention will be explained in relation to examples according to the present invention with reference to the drawings. However, throughout the drawings for illustrating the examples, like components having like function will be denoted by like symbols, and the redundant explanation of them will be omitted. Also, in the examples described below, redundant explanation of the same or similar portions will not be in principle repeated other than particularly required.

EXAMPLE 1

FIG. 1 is a cross sectional view of a substantial portion of a semiconductor device of an example 1 of the present invention.

The main surface of a semiconductor substrate 1 is divided into each of element regions by a field insulating film 2, and a diffusion layer 3 including a source region, drain region and the like is formed in each of the element regions. A gate electrode 4 composed of polycrystalline silicon is formed through a gate insulating film (not shown) between the regions of the source region and drain region 3 on the main surface of the semiconductor substrate 1, and lateral sides of the gate electrode 4 are covered with a side wall insulating film 5.

The diffusion layer 3 or the gate electrode 4 formed on the main surface of the semiconductor substrate 1 is connected to one end of a plug 7 through an interlayer insulating film 6, and the other end of the plug 7 is connected to a laminated single Damascene wiring portion 10 through the interlayer insulating film 6. The interlayer insulating film 6 is formed by depositing a P—SiN film (50 nm), HDP—SiO film (400 nm) and P—SiO film (400 nm) in sequence, and subsequently by polishing by about 500 nm (an amount of polishing the large area of the wiring portion) using CMP technology to planarize a step between elements created by the gate electrode 4 and the like.

The plug 7 is formed by depositing a titanium film (10 nm) and titanium nitride film (50 nm) by spattering and a tungsten film by CVD in sequence and processing by CMP.

A single Damascene wiring portion 10 is formed by depositing a tantalum nitride film (15 nm), tantalum film (15 nm) and copper film (80 nm) by spattering and a copper film (500 nm) by plating in sequence, then by heat-treating for 2 min at 400° C. in a hydrogen atmosphere and processing by CMP technology.

A dual Damascene wiring portion 23 is connected to the single Damascene wiring portion 10 through an interlayer insulating film 16 having an air-gap 17 in a small space between adjacent single Damascene wiring portions 10. At this time, a partial film 15 of the insulating film used at the time of forming the single Damascene wiring portion 10 remains under a via portion of the dual Damascene wiring portion 23 offset from the single Damascene wiring portion 10.

The dual Damascene wiring portions 23, 27 and 30, similarly to the single Damascene wiring portion 10, is formed by depositing a tantalum nitride film (15 nm), tantalum film (15 nm) and copper film (80 nm) by spattering and a copper film (500 nm) by plating in sequence, then by heat-treating for 2 min at 400° C. in a hydrogen atmosphere and processing by CMP technology.

The dual Damascene wiring portion 27 is connected to the dual Damascene wiring portion 23 through an interlayer insulating film 26 having an air-gap 25 in a small space between adjacent dual Damascene wiring portions 23. At this time, a partial film 24 of the interlayer insulating film 16 remains under a via portion of the dual Damascene wiring portion 27 offset from the dual Damascene wiring portion 23.

The dual Damascene wiring portion 30 is connected to the dual Damascene wiring portion 27 through an interlayer insulating film 29 having an air-gap 28 in a small space between adjacent dual Damascene wiring portions 27. At this time, a partial film 31 of the interlayer insulating film 26 remains under a via portion of the dual Damascene wiring portion 30 offset from the dual Damascene wiring portion 27.

In this example, issues of an increase in resistance due to a defectively buried metal in the via portion and an increase in parasitic capacitance due to an intrusion of metal into the air-gap can be avoided, because there is no contact between the via portion and the air-gap.

Now, a method for producing a semiconductor device according to the example 1 will be explained for each of steps with reference to FIGS. 3 to 11.

First, after the main surface of a semiconductor substrate 1 is divided into each of element regions by a field insulating film 2, a diffusion layer 3 including a source region, drain region and the like in each of the element regions, and a gate electrode 4 composed of polycrystalline silicon is formed through a gate insulating film (not shown) between the regions of the source region and drain region 3 on the main surface of the semiconductor substrate 1, subsequently, lateral sides of the gate electrode 4 are covered with a side wall insulating film 5.

An interlayer insulating film 6 is formed by depositing a P—SiN film (50 nm), HDP—SiO film (400 nm) and P—SiO film (400 nm) in sequence, and subsequently by polishing by about 500 nm (an amount of polishing a large area gate) using CMP technology to planarize a step between elements created by the gate electrode 4 and the like.

Next, after a connection hole is made by a normal photographic and drying technology, a naturally oxidized film on the bottom of the connection hole is removed by Ar plasma, subsequently a plug 7 is formed by depositing a Ti/TiN film 7a (10/50 nm) and a CVDW film 7b (300 nm) by spattering in sequence, and then, by removing the Ti/TiN film and the CVDW film except for those in the connection hole by CMP technology.

Next, after depositing a SiCN/SiC film 8 (25/25 nm) and a FSG film 9 (a first insulating film) which is an inorganic insulating film (300 nm), a groove for forming a wiring portion 10 is formed by a normal photographic and drying technology.

Figure 3:
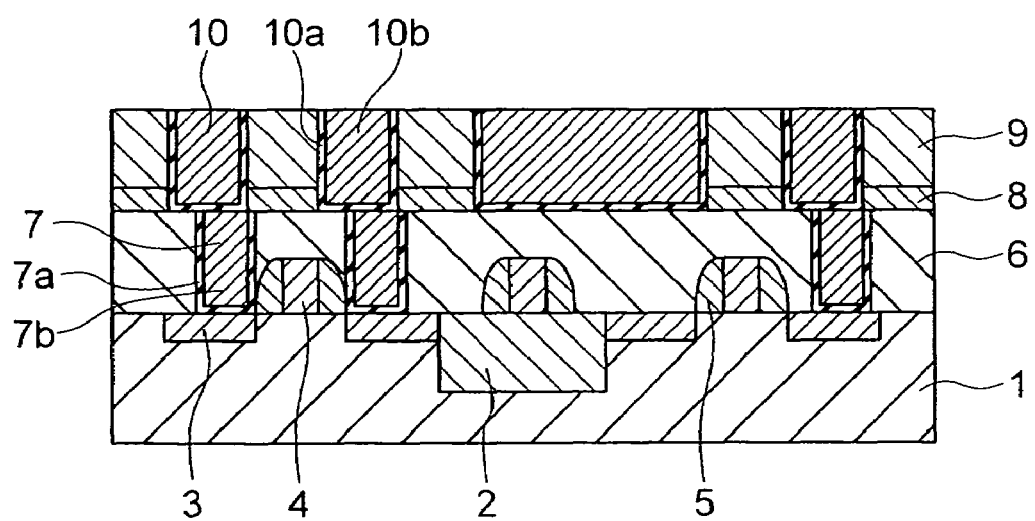
FIG. 3 is a longitudinal sectional view illustrating formation of a wiring layer in the semiconductor device of the example 1 according to the present invention for each of steps.

Next, after a naturally oxidized film on the surface of the plug 7 exposed on the bottom of the groove is removed by Ar plasma, a single Damascene wiring portion 10 is formed by depositing a tantalum nitride/tantalum film 10a (15/15 nm) by spattering which is a barrier metal film, and a copper film by spattering and a copper film by plating (a first conductive film) 10b (80/500 nm) which is a main conductive film in sequence, and then by heat-treating for 2 min at 400° C. in a hydrogen atmosphere and removing the tantalum nitride/tantalum/copper film except for those in the groove by CMP. FIG. 3 shows these situations.

Figure 4:
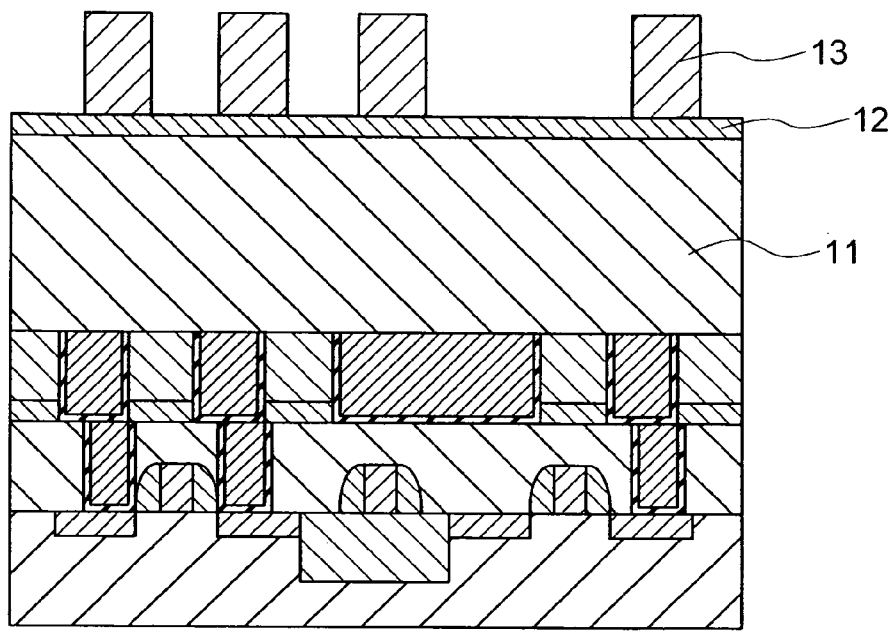
FIG. 4 is a longitudinal sectional view illustrating the formation of the wiring layer in the semiconductor device of the example 1 according to the present invention for each of the steps.

Next, after depositing a SiLK film 11 (a second insulating film) (700 nm) which is an organic insulating film and a P-TEOS film 12 (100 nm), a convex resist 13 is formed. The resist 13, which is columnar, is formed to cover a formation region of the connection hole for exposing the upper surface of the single Damascene wiring portion 10 to be formed in a later step. FIG. 4 shows these situations.

Next, a sacrifice film pillar 14 composed of the SiLK film is formed by etching the P-TEOS film 12 using the resist 13 as a mask, in succession, etching the SiLK film 11 using the resist 13 and P-TEOS film 12 as a mask. At this step, the P-TEOS film 12 on the surface of the SiLK film remains.

Figure 5:
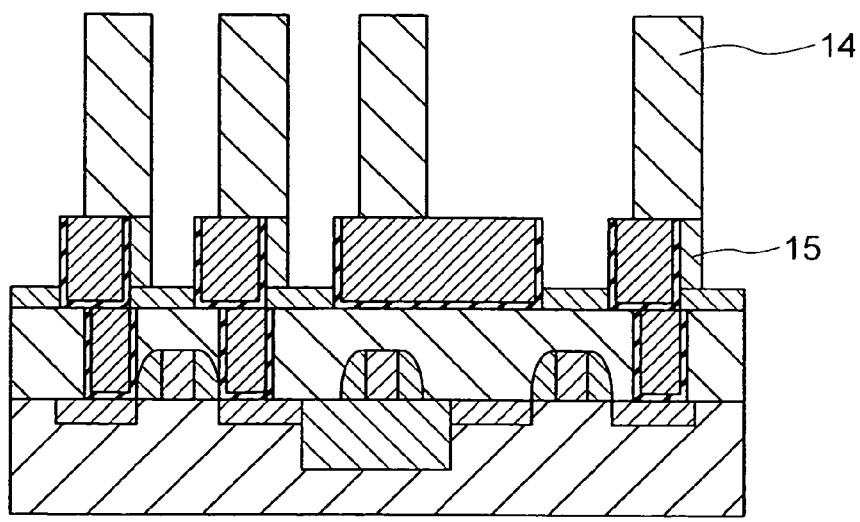
FIG. 5 is a longitudinal sectional view illustrating the formation of the wiring layer in the semiconductor device of the example 1 according to the present invention for each of the steps.

Next, the FSG film 9 in a region not covered with the sacrifice film pillar is removed by etching the FSG film 9 in an anisotropic way between the single Damascene wiring portions 10. At this time, a part of the FSG film 9 lying under the sacrifice film pillar 14 remains to form a FSG film 15. FIG. 5 shows these situations.

Figure 6:
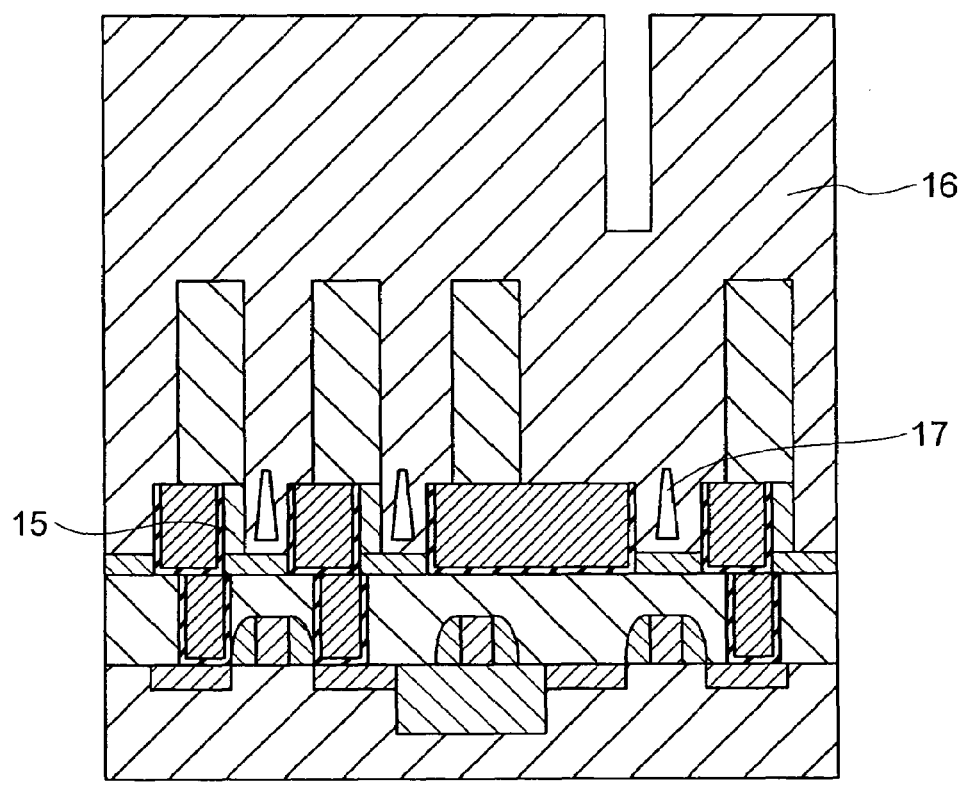
FIG. 6 is a longitudinal sectional view illustrating the formation of the wiring layer in the semiconductor device of the example 1 according to the present invention for each of the steps.

Next, a FSG film 16 (a third insulating film) (1200 nm), which is an inorganic insulating film, is formed. At this time, the FSG film 16 is formed by depositing using the CVD method under a low coverage formation condition so that an air-gap 17 is formed in a small space between adjacent the single Damascene wiring portions 10. Alternately, the FSG film 16 may be formed by depositing using CVD method in such a manner that during an initial formation step, a low coverage formation condition is used to form the air-gap 17 and after the air-gap 17 is formed, a high coverage condition is used to bury a space between the sacrifice film pillars 14. Further, it is necessary to deposit to such a film thickness that the surface of the FSG film 16 is higher than the upper surface of the sacrifice film pillar 14. FIG. 6 shows these situations.

Figure 7:
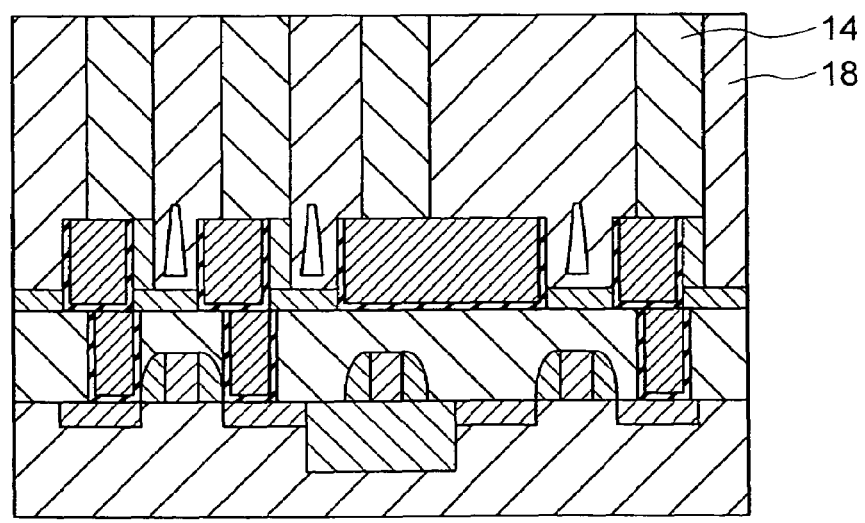
FIG. 7 is a longitudinal sectional view illustrating the formation of the wiring layer in the semiconductor device of the example 1 according to the present invention for each of the steps.

Next, the surface of the FSG film 16 is planarized by CMP to expose the surface of the sacrifice film pillar 14, and to form an interlayer insulating film 18 for forming a dual Damascene wiring portion composed of the FSG film. At this step, the P-TEOS film 12 is not left behind on the surface of the sacrifice film pillar 14. FIG. 7 shows these situations.

Figure 8:
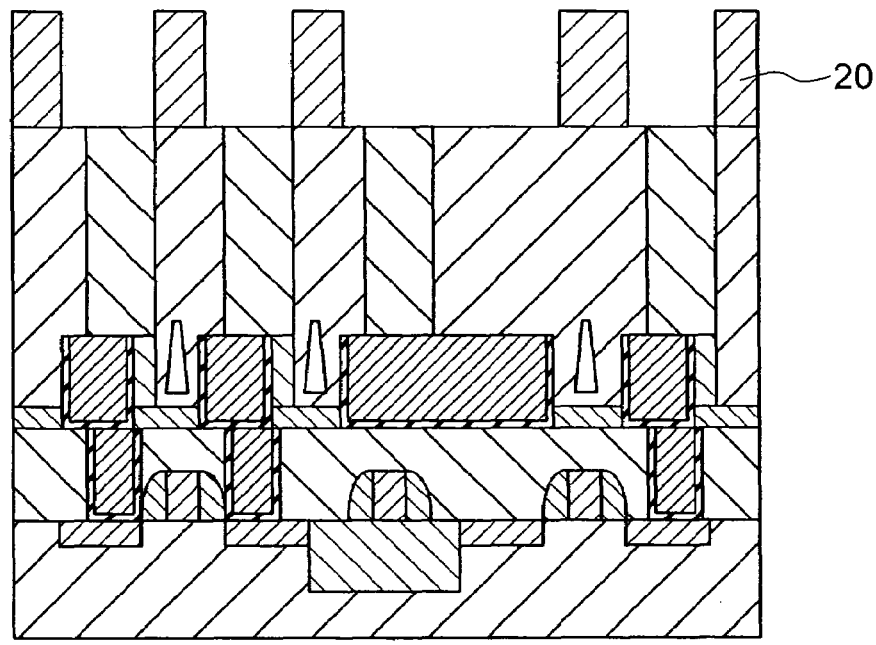
FIG. 8 is a longitudinal sectional view illustrating the formation of the wiring layer in the semiconductor device of the example 1 according to the present invention for each of the steps.

Next, a resist pattern 20 for forming the dual Damascene wiring portion is formed. FIG. 8 shows these situations.

Figure 9:
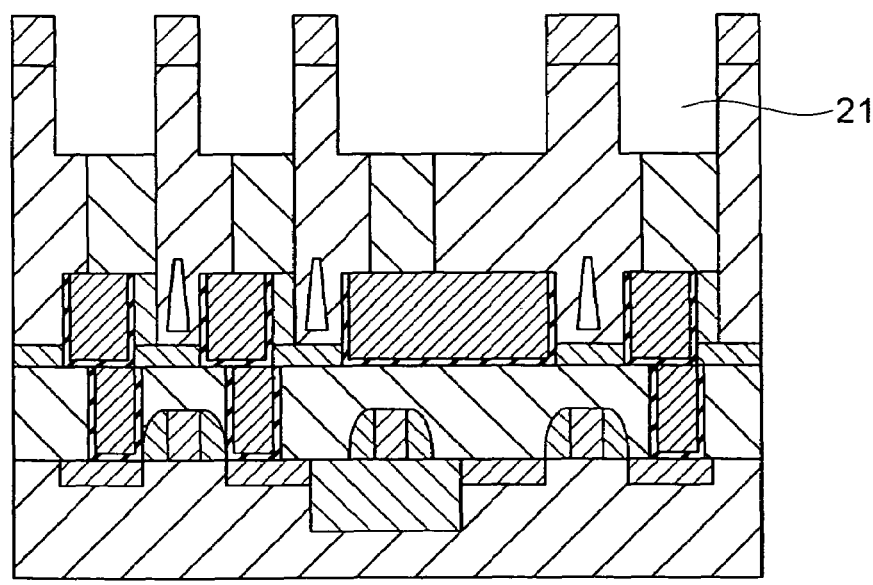
FIG. 9 is a longitudinal sectional view illustrating the formation of the wiring layer in the semiconductor device of the example 1 according to the present invention for each of the steps.

Next, a groove 21 for wiring of the dual Damascene wiring portion is formed by etching the sacrifice film pillar 14 and interlayer insulating film 18 at an approximately similar etching rate for both of them using the resist pattern 20 as a mask. FIG. 9 shows these situations.

Figure 10:
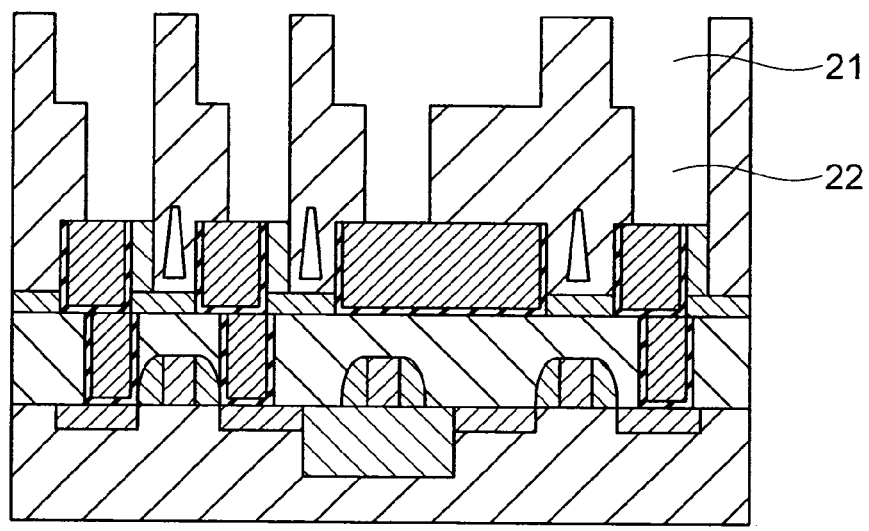
FIG. 10 is a longitudinal sectional view illustrating the formation of the wiring layer in the semiconductor device of the example 1 according to the present invention for each of the steps.

Next, a connection hole 22 for a via portion of the dual Damascene wiring portion is formed by selectively removing the sacrifice film pillar 14 using NH3 plasma. FIG. 10 shows these situations.

Figure 11:
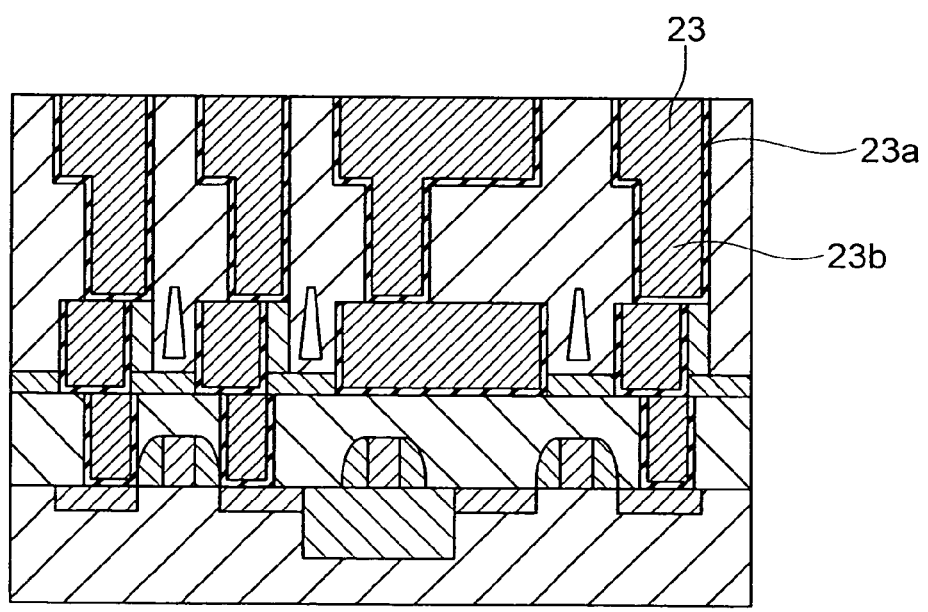
FIG. 11 is a longitudinal sectional view illustrating the formation of the wiring layer in the semiconductor device of the example 1 according to the present invention for each of the steps.

Next, after removing and cleaning etching polymer, similarly to the formation of the single Damascene wiring portion 10, a naturally oxidized film on the surface of the single Damascene wiring portion 10 exposed on the bottom of the connection hole 22 is removed by Ar plasma, subsequently a dual Damascene wiring portion 23 is formed by depositing a tantalum nitride/tantalum film 23a (15/15 nm) by spattering which is a barrier metal film, and a copper film by spattering and a copper film by plating (a second conductive film) 23b (80/500 nm) which is a main conductive film in sequence, then by heat-treating for 2 min at 400° C. in a hydrogen atmosphere and by removing the tantalum nitride/tantalum/copper film except for those in the connection hole 22 and the groove 21 by CMP technology. FIG. 11 shows these situations.

The situations shown in FIG. 1 illustrates the dual Damascene wiring portion in multiple layers in which air-gaps 25, 28 are formed between adjacent dual Damascene wiring portions 23 and also in a small space between dual Damascene wiring portions 27 by repeating the above steps.

In the example described above, the example using Cu for the main conductive film for the single Damascene wiring portion 10 or the dual Damascene wiring portion 23 has been shown, but not to be limited to this, at least any one of metals including Al, W, Ag and Au may be used as the main conductive film.

In this example, a stable connection of the via to the underlying Damascene wiring portion having the air-gap structure can be achieved, because the air-gap to be disposed between adjacent Damascene wiring portions can be formed apart from the via portion due to the formation of the sacrifice film pillar, and so contact between the air-gap and the via portion dose not occur even if misalignment is caused.

Figure 12A:
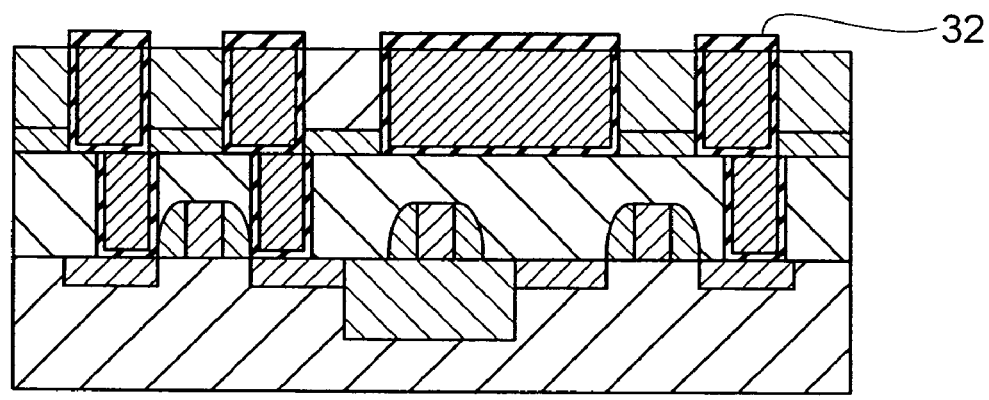
FIG. 12(A) is a longitudinal sectional view of the substantial portion of the semiconductor device of the example 1 of the present invention.
Figure 12B:
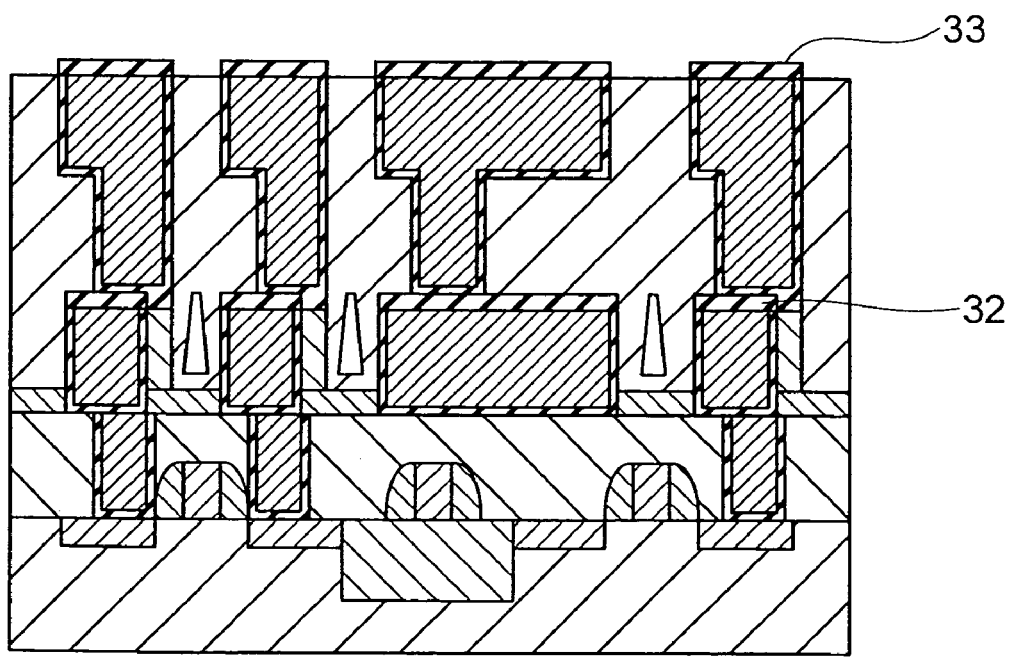
FIG. 12(B) is a longitudinal sectional view of the substantial portion of the semiconductor device of the example 1 of the present invention.

In the example described above, improvement in reliability of the Damascene wiring portions 10, 23 and the like can be achieved, after forming the Damascene wiring portions 10, 23, by selectively forming a CoWB alloyed films 32, 33 as a metal cap film on the surface of the Damascene wiring portions. However, not to be limited to the CoWB alloyed film, at least any one of metals and metallic compounds including Co, W, Ni, Cr and Au may be used as the metal cap film. FIGS. 12(A), (B) show these situations.

Figure 13A:
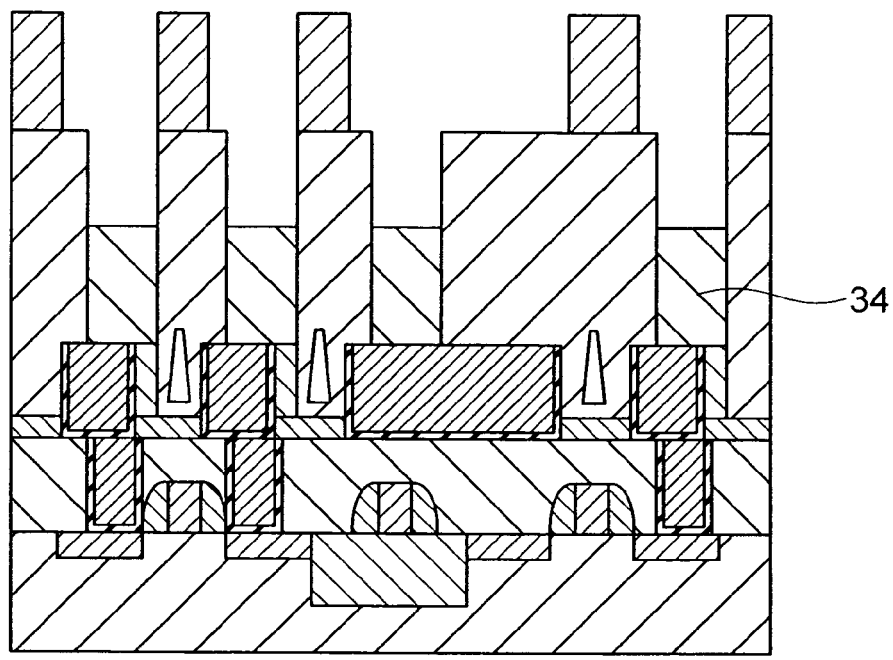
FIG. 13(A) is a longitudinal sectional view of the substantial portion of the semiconductor device of the example 1 of the present invention.
Figure 13B:
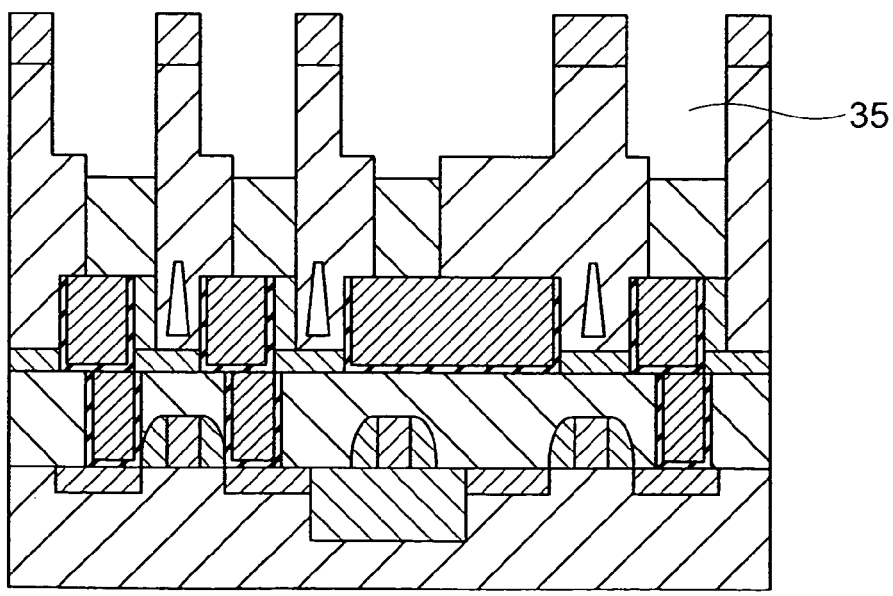
FIG. 13(B) is a longitudinal sectional view of the substantial portion of the semiconductor device of the example 1 of the present invention.
Figure 13C:
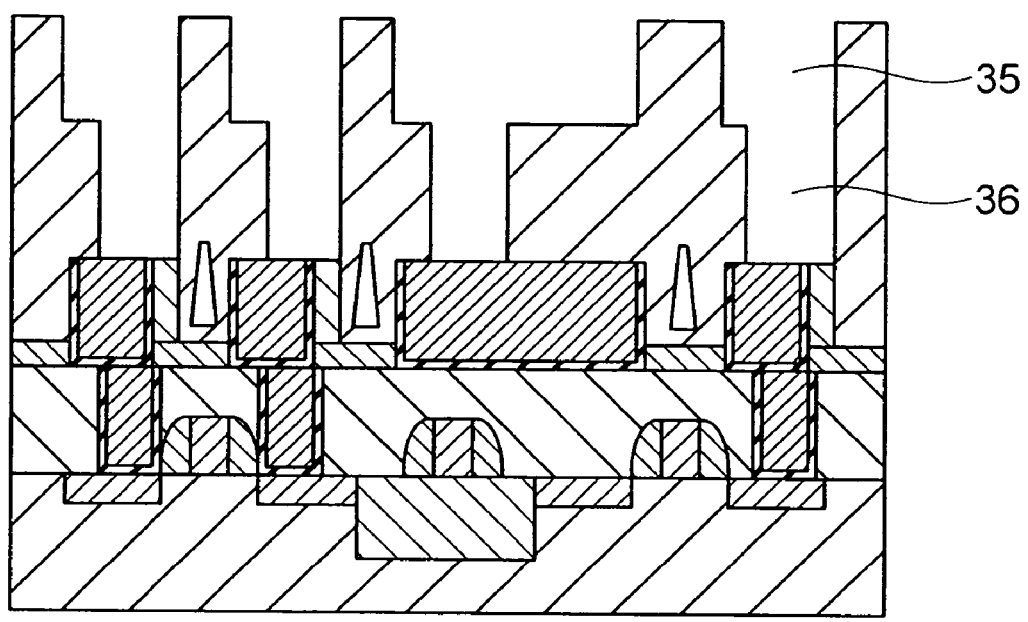
FIG. 13(C) is a longitudinal sectional view of the substantial portion of the semiconductor device of the example 1 of the present invention.

Also, in the example described above, as shown in FIG. 9, the groove 21 for wiring of the dual Damascene wiring portion 23 is formed by etching the sacrifice film pillar 14 and the interlayer insulating film 18 at an approximately like etching rate, but, as shown in FIGS. 13(A) to (C), also, after only an upper part of the sacrifice film pillar 14 is etched back to near a depth of the groove, a groove 35 may be formed in the interlayer insulating film 18. Next, a connection hole 36 is formed by selectively removing an under part 34 of the sacrifice film pillar. This method is useful for a case where it is difficult to etch the sacrifice film pillar 14 and the interlayer insulating film 18 at the approximately like etching rate.

Figure 14A:
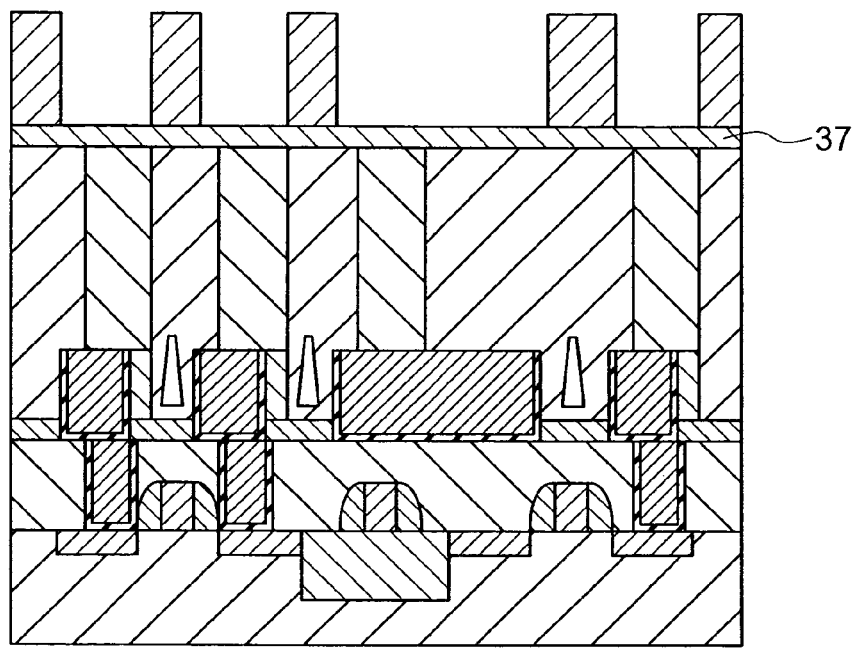
FIG. 14(A) is a longitudinal sectional view of the substantial portion of the semiconductor device of the example 1 of the present invention.
Figure 14B:
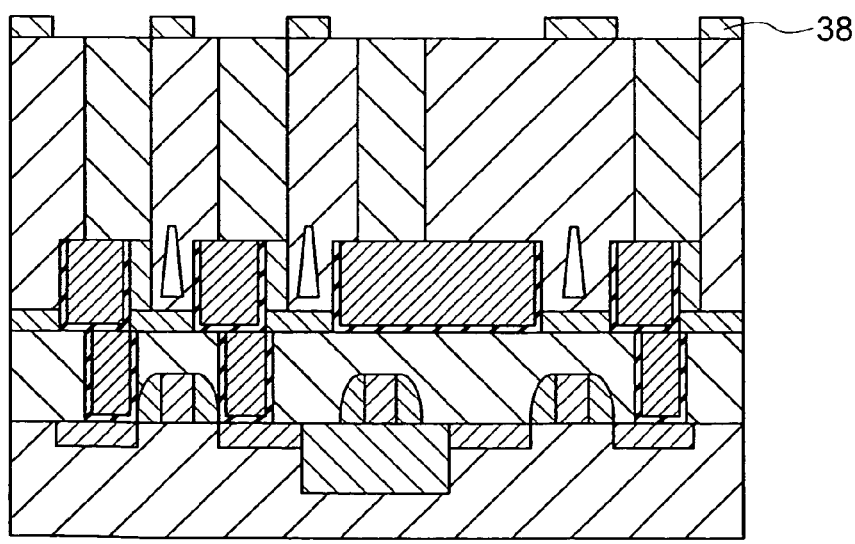
FIG. 14(B) is a longitudinal sectional view of the substantial portion of the semiconductor device of the example 1 of the present invention.

Moreover, in the groove processing shown in FIG. 9 or FIG. 13(B), there may be an insufficient resist 20, then, as shown in FIG. 14, a SiN hard mask 38 is formed from an additional P—SiN film 37, and the groove may be also processed by using this mask as a mask.

EXAMPLE 2

Figure 15:
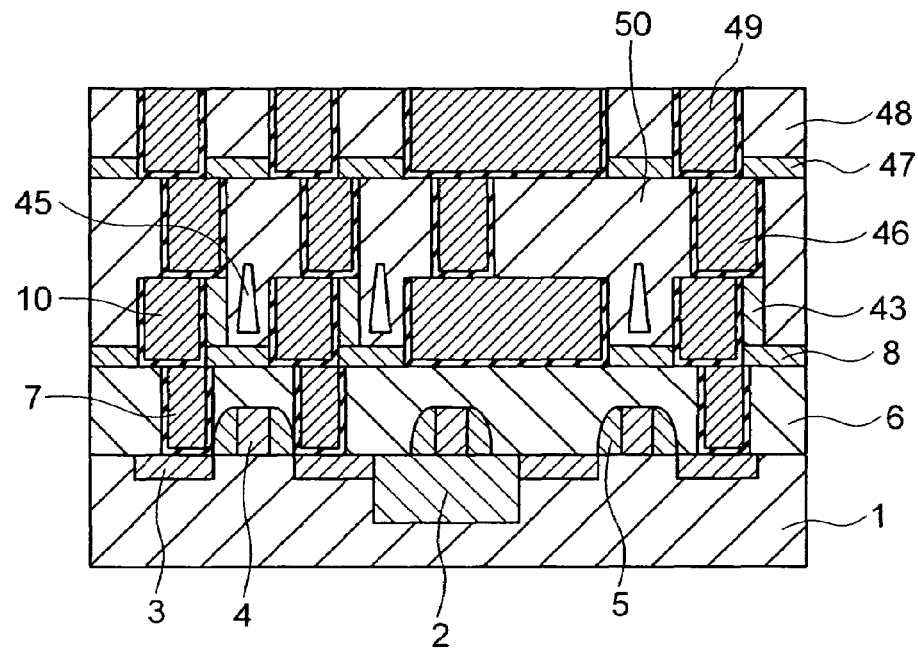
FIG. 15 is a longitudinal sectional view of a substantial portion of a semiconductor device of an example 2 of the present invention.

FIG. 15 is a cross sectional view of a substantial portion of a semiconductor device of an example 2 of the present invention.

The main surface of a semiconductor substrate 1 is divided into each of element regions by a field insulating film 2, and a diffusion layer 3 including a source region, drain region and the like is formed in each of the element regions. A gate electrode 4 composed of polycrystalline silicon is formed through a gate insulating film (not shown) between the regions of the source region and drain region 3 on the main surface of the semiconductor substrate 1, and lateral sides of the gate electrode 4 are covered with a side wall insulating film 5.

The diffusion layer 3 or the gate electrode 4 formed on the main surface of the semiconductor substrate 1 is connected to one end of a plug 7 through an interlayer insulating film 6, and the other end of the plug 7 is connected to a laminated single Damascene wiring portion 10 through the interlayer insulating film 6. The interlayer insulating film 6 is formed by depositing a P—SiN film (50 nm), HDP—SiO film (400 nm) and P—SiO film (400 nm) in sequence, and subsequently by polishing by about 500 nm (an amount of polishing the large area of the wiring portion) using CMP technology to planarize a step between elements created by the gate electrode 4 and the like.

The plug 7 is formed by depositing a titanium film (10 nm) and titanium nitride film (50 nm) by spattering, and a tungsten film by CVD in sequence and working using CMP.

The single Damascene wiring portion 10 is formed by depositing a tantalum nitride film (15 nm), tantalum film (15 nm) and copper film (80 nm) by spattering and a copper film (500 nm) by plating in sequence, then by heat-treating for 2 min at 400° C. in a hydrogen atmosphere and working using CMP technology.

A single Damascene wiring portion 49 is connected to the single Damascene wiring portion 10 through a via 46 passing through a interlayer insulating film 50 having an air-gap 45 in a small space between adjacent single Damascene wiring portions 10. At this time, a partial film 43 of the insulating film used at the time of forming the single Damascene wiring portion 10 remains under a via 46 offset from the single Damascene wiring portion 10.

In this example, issues of an increase in resistance due to a defectively buried metal in the via and an increase in parasitic capacitance due to an intrusion of metal into the air-gap can be avoided, because there is no contact between the via and the air-gap.

Figure 17:
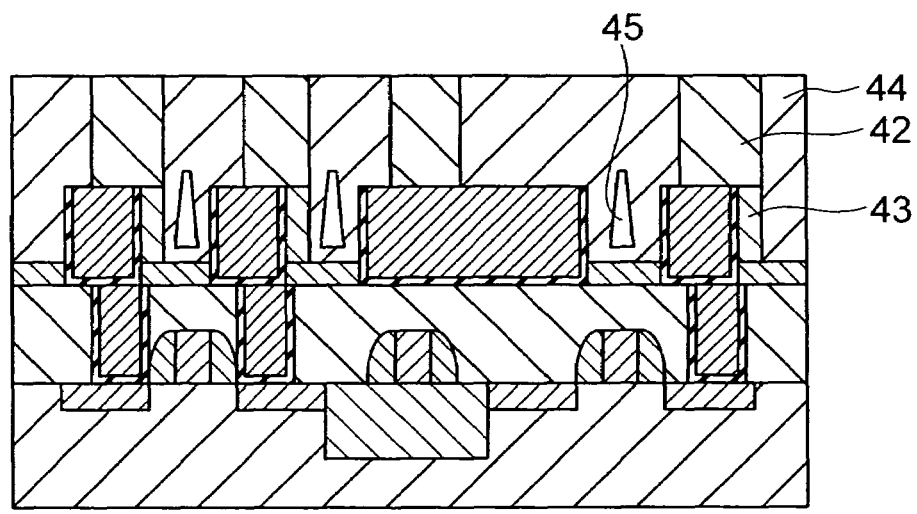
FIG. 17 is a longitudinal sectional view illustrating the formation of the wiring layer in the semiconductor device of the example 2 according to the present invention for each of the steps.
Figure 18:
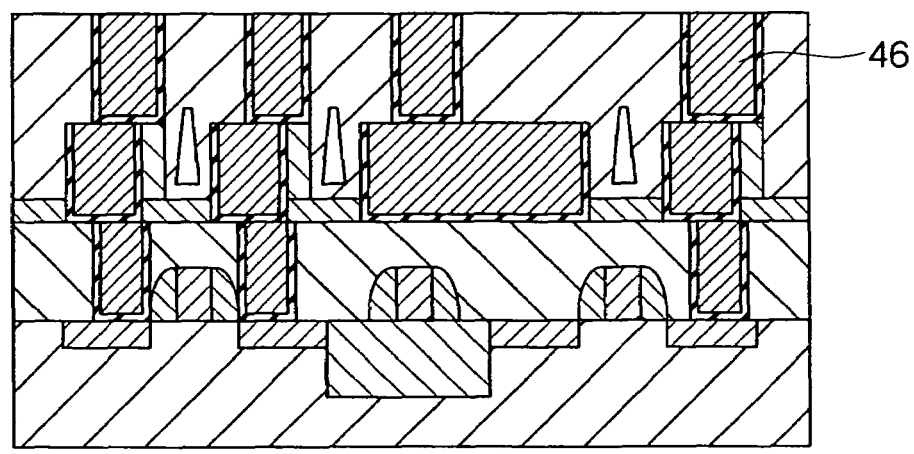
FIG. 18 is a longitudinal sectional view illustrating the formation of the wiring layer in the semiconductor device of the example 2 according to the present invention for each of the steps.

Now, a method for producing a semiconductor device according to the example 2 will be explained for each of steps with reference to FIGS. 16 to 18.

First, after the steps of the example 1 shown in FIG. 3, and after depositing a SiLK film (a second insulating film) 39 (400 nm) which is an organic insulating film and a P-TEOS film 40 (100 nm), a convex resist 41 is formed. The resist 41, which is columnar, is formed to cover a formation region of a connection hole for exposing the upper surface of the single Damascene wiring portion 10 to be formed in a later step. FIG. 16 shows these situations.

Next, a sacrifice film pillar 42 composed of the SiLK film is formed by etching the P-TEOS film 40 using the resist 41 as a mask, and in succession, by etching the SiLK film 39 using the resist 41 and P-TEOS film 40 as a mask. At this step, The P-TEOS film 40 on the surface of the SiLK film remains.

Next, a FSG film 9 in a region not covered with the sacrifice film pillar is removed by etching the FSG film 9 in an anisotropic way between the single Damascene wiring portions 10. At this time, a part of the FSG film 9 under the sacrifice film pillar 42 remains to form a FSG film 43.

Next, a FSG film (a third insulating film) (800 nm), which is an inorganic insulating film, is formed. At this time, the FSG film is formed by depositing using CVD method under a low coverage formation condition so that an air-gap 45 is formed in a small space between adjacent the single Damascene wiring portions 10. Alternately, the FSG film may be formed by depositing using CVD method in such a manner that during an initial formation step, a low coverage formation condition is used to form the air-gap 45 and after the air-gap 45 is formed, a high coverage formation condition is used to bury a space between the sacrifice film pillars 42. Further, it is necessary to deposit to such a film thickness that the surface of the FSG film is higher than the upper surface of the sacrifice film pillar 42.

Next, the surface of the FSG film is planarized by CMP to expose the surface of the sacrifice film pillar 42, and to form an interlayer insulating film 44 for forming a via composed of the FSG film. FIG. 17 shows these situations.

Next, a connection hole which reaches the single Damascene wiring portion 10 is made by selectively removing the sacrifice film pillar 42 using NH3 plasma.

Next, after removing and cleaning etching polymer, a naturally oxidized film on the surface of the single Damascene wiring portion 10 exposed on the bottom of the connection hole is removed by Ar plasma, subsequently a via 46 is formed by depositing a tantalum nitride/tantalum film (15/15 nm) by spattering which is a barrier metal film, and a copper film by spattering and a copper film by plating (a second conductive film) (80/500 nm) which is a main conductive film in sequence, then by heat-treating for 2 min at 400° C. in a hydrogen atmosphere and by removing the tantalum nitride/ tantalum/copper film except for those in the connection hole by CMP technology. FIG. 18 shows these situations.

Now, FIG. 15 referred to above shows that by using the same method for forming the single Damascene wiring portion 10, a groove is formed after depositing a SiCN/SiC film 47 and a FSG film 48 which is an inorganic insulating film, then in this groove, a single Damascene wiring portion 49 is formed.

However, not shown, a Damascene wiring portion having three or more layers may be also formed by repeating the steps described above.

In the embodiment described above, the example using Cu for the main conductive film for the single Damascene wiring portions 10, 49 or the via 46 has been shown, but not to be limited to this, at least any one of metals including Al, W, Ag and Au may be used as the main conductive film.

In this example, a stable connection of the via to the underlying Damascene wiring portion having the air-gap structure can be achieved, because the air-gap formed between adjacent Damascene wiring portions can be formed apart from the via due to the formation of the sacrifice film pillar, and so contact between the air-gap and the via dose not occur even if misalignment or the like is caused.

Figure 19:
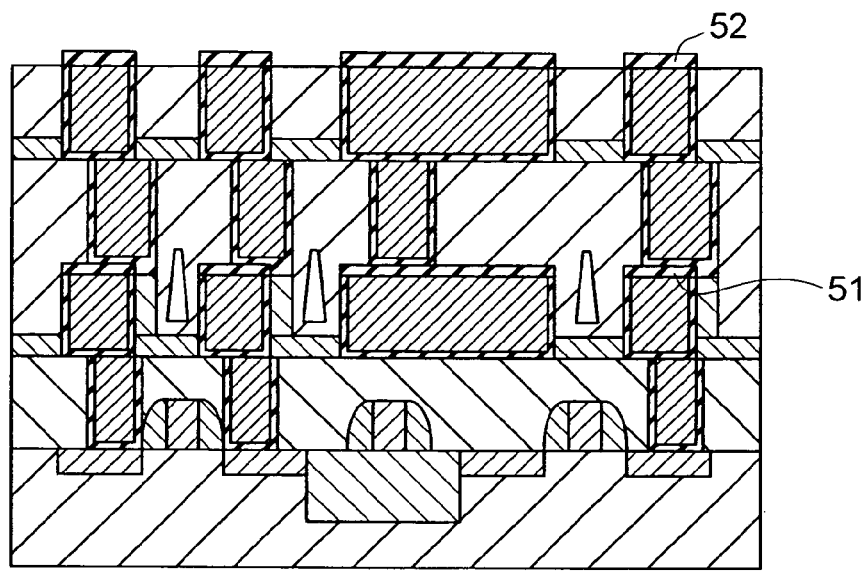
FIG. 19 is a longitudinal sectional view of a substantial portion of the semiconductor device of the example 2 of the present invention.

Further, in the example described above, after forming the Damascene wiring portions 10, 49 and the like, improvement in reliability of the Damascene wiring portions 10, 49 and the like can be achieved by selectively forming CoWB alloyed films 51, 52 as a metal cap film on the surface of the Damascene wiring portions. However, not to be limited to the CoWB alloyed film described above, at least any one of metals and metallic compounds including Co, W, Ni, Cr and Au may be used as the metal cap film. FIG. 19 shows these situations.

However, not shown, a CoWB alloyed film may be also formed on the surface of the via 46.

Moreover, as shown in FIG. 14, a hard mask processing using a P—SiN film may be also applicable.

EXAMPLE 3

Figure 20:
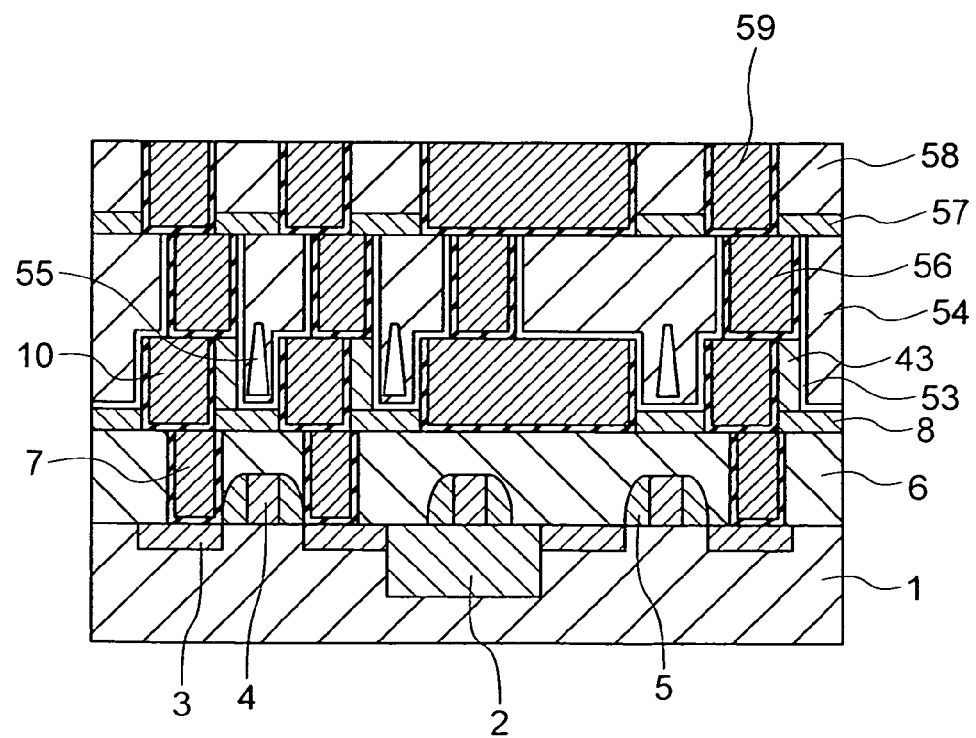
FIG. 20 is a longitudinal sectional view of a substantial portion of a semiconductor device of an example 3 of the present invention.

FIG. 20 is a cross sectional view of a substantial portion of a semiconductor device of an example 3 of the present invention.

The main surface of a semiconductor substrate 1 is divided into each of element regions by a field insulating film 2, and a diffusion layer 3 including a source region, drain region and the like is formed in each of the element regions. A gate electrode 4 composed of polycrystalline silicon is formed through a gate insulating film (not shown) between the regions of the source region and drain region 3 on the main surface of the semiconductor substrate 1, and lateral sides of the gate electrode 4 are covered with a side wall insulating film 5.

The diffusion layer 3 or the gate electrode 4 formed on the main surface of the semiconductor substrate 1 is connected to one end of a plug 7 through an interlayer insulating film 6, and the other end of the plug 7 is connected to a laminated single Damascene wiring portion 10 through the interlayer insulating film 6. The interlayer insulating film 6 is formed by depositing a P—SiN film (50 nm), HDP—SiO film (400 nm) and P—SiO film (400 nm) in sequence, and subsequently by polishing by about 500 nm (an amount of polishing the large area of the wiring portion) using CMP technology to planarize a step between elements created by the gate electrode 4 and the like.

The plug 7 is formed by depositing a titanium film (10 nm) and titanium nitride film (50 nm) by spattering and a tungsten film by CVD in sequence, and subsequently by processing by CMP.

The single Damascene wiring portion 10 is formed by depositing a tantalum nitride film (15 nm), tantalum film (15 nm) and copper film (80 nm) by spattering, and a copper film (500 nm) by plating in sequence, then by heat-treating for 2 min at 400° C. in a hydrogen atmosphere and working by CMP technology.

A single Damascene wiring portion 59 is connected to the single Damascene wiring portion 10 through a via 56 passing through a interlayer insulating film 54 having an air-gap 55 in a small space between adjacent single Damascene wiring portions 10. At this time, a partial film 43 of the insulating film 9 used at the time of forming the single Damascene wiring portion 10 remains under the via 56 offset from the single Damascene wiring portion 10.

Also, an insulating film 53 intervenes between the interlayer insulating film 54, and the single Damascene wiring portion 10 and the via 56.

In this example, issues of an increase in resistance due to a defectively buried metal in the via and an increase in parasitic capacitance due to an intrusion of metal into the air-gap can be avoided, because there is no contact between the via and the air-gap.

Figure 21:
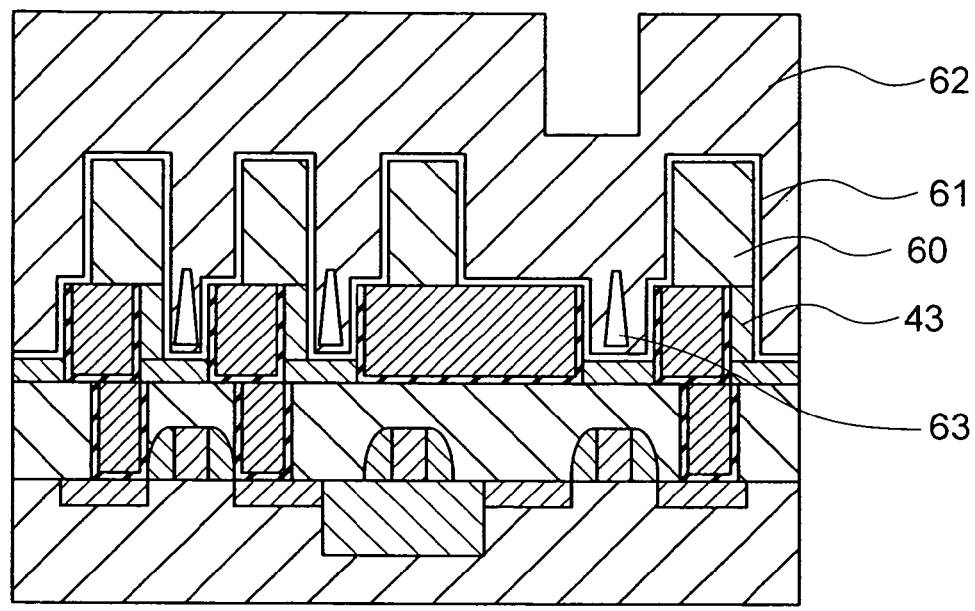
FIG. 21 is a longitudinal sectional view illustrating formation of a wiring layer in the semiconductor device of the example 3 according to the present invention for each of processes.
Figure 22:
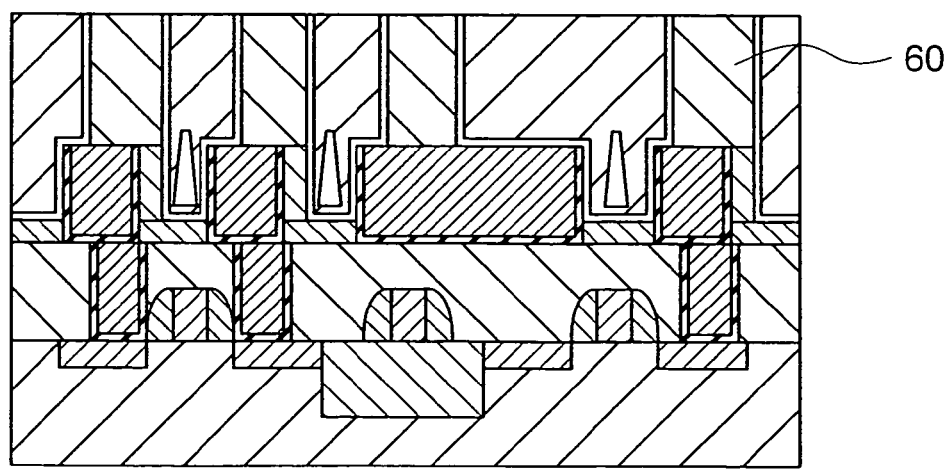
FIG. 22 is a longitudinal sectional view illustrating the formation of the wiring layer in the semiconductor device of the example 3 according to the present invention for each of the steps.
Figure 23:
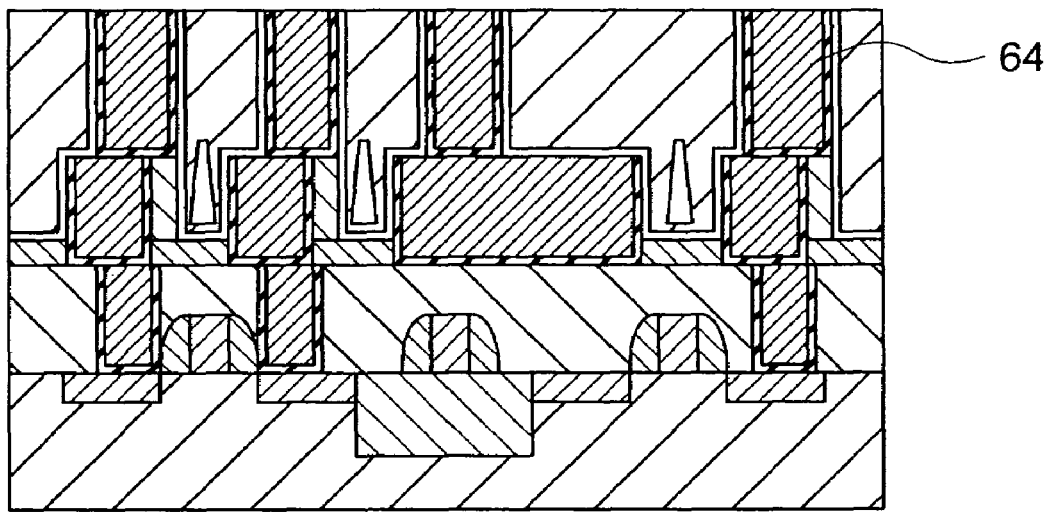
FIG. 23 is a longitudinal sectional view illustrating the formation of the wiring layer in the semiconductor device of the example 3 according to the present invention for each of the steps.

Now, a method for producing a semiconductor device according to the example 3 will be explained for each of steps with reference to FIGS. 21 to 23.

Figure 16:
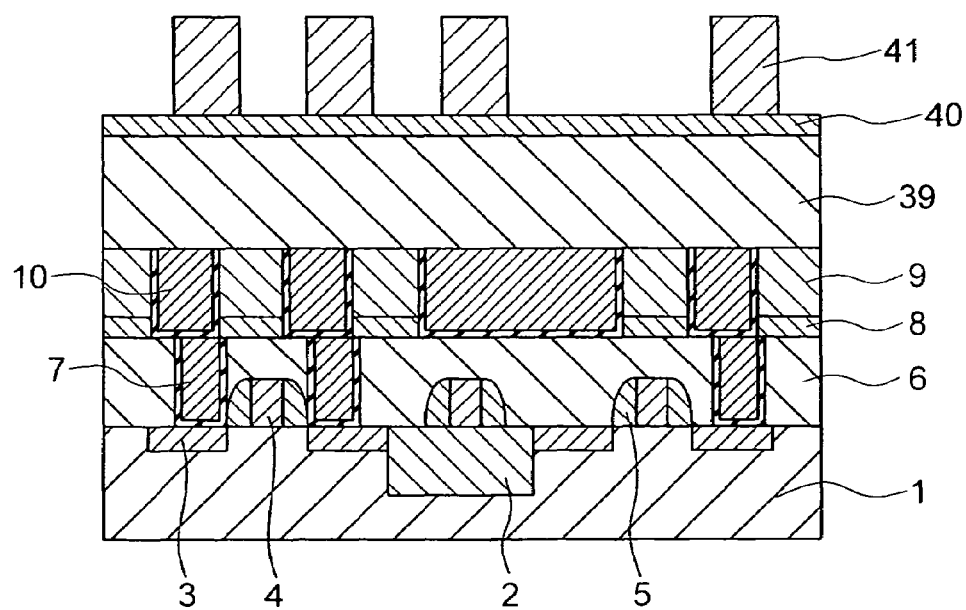
FIG. 16 is a longitudinal sectional view illustrating formation of a wiring layer in the semiconductor device of the example 2 according to the present invention for each of steps.

After the steps of the example 2 shown in FIG. 16, a sacrifice film pillar 60 composed of the SiLK film is formed by etching the P-TEOS film 40 using the resist 41 as a mask and etching the SiLK film 39 using the resist 41 and P-TEOS film 40 as a mask. At this step, the P-TEOS film 40 on the surface of the SiLK film remains.

Next, the FSG film 9 in a region not covered with the sacrifice film pillar is removed by etching the FSG film 9 in an anisotropic way between the single Damascene wiring portions 10. At this time, a part of the FSG film 9 under the sacrifice film pillar 60 remains to form a FSG film 43.

Next, a SiC film 61 (10 nm) and porous SiOC film (a third insulating film) 62 (800 nm) are deposited. FIG. 21 shows these situations. At this time, during an initial formation of the porous SiOC film 62, deposition is performed under a low coverage formation condition so that an air-gap 63 is formed in a small space between adjacent single Damascene wiring portions 10. Further, it is necessary to deposit to such a film thickness that the surface of the porous SiOC film 62 is higher than the upper surface of the sacrifice film pillar 60.

Next, the porous SiOC film 62 and SiC film 61 are planarized by CMP to expose the surface of the sacrifice film pillar 60. FIG. 22 shows these situations. The SiC film 61 on the surface of the sacrifice film pillar 60 may be removed by CMP or selectively etching.

Next, a connection hole which reaches the single Damascene wiring portion 10 is formed by selectively removing the sacrifice film pillar 60 using NH3 plasma.

Next, after cleaning etching polymer, a naturally oxidized film on the surface of the single Damascene wiring portion 10 exposed on the bottom of the connection hole is removed by Ar plasma, subsequently a via 64 is formed by depositing a tantalum nitride/tantalum film (15/15 nm) by spattering which is a barrier metal film, and a copper film by spattering and a copper film by plating (a second conductive film) (80/500 nm) which is a main conductive film in sequence, then by heat-treating for 2 min at 400° C. in a hydrogen atmosphere and removing the tantalum nitride/tantalum/copper film except for those in the connection hole by CMP technology. FIG. 23 shows these situations.

Next, FIG. 20 referred to above shows situations that by using the same method for forming the single Damascene wiring portion 10, after depositing a SiCN/SiC film 57 and a FSG film 58 which is an inorganic insulating film, a groove is formed, then in this groove, a single Damascene wiring portion 59 is formed.

However, not shown, a Damascene wiring portion having three or more layers may be also formed by repeating the steps described above.

In this example, a stable connection of the via to the underlying Damascene wiring portion having the air-gap structure can be achieved, because the air-gap to be disposed between adjacent Damascene wiring portions can be formed apart from the via due to the formation of the sacrifice film pillar, and so contact between the air-gap and the via portion dose not occur even if misalignment or the like is caused.

Moreover, because of a structure in which the via 64 will not contact directly with the porous SiOC film 62, a defect of via poisoning due to gas seeping from the porous SiOC film 62 can be prevented.

Further, a formation of the cap metal film on the surface of the Damascene wiring portion, a hard mask processing and the like will not be described, but it is certain that these may be also applicable, similarly to the examples 1 and 2.

Although the present invention made by the present inventors has been specifically explained in relation to the examples above, the present invention is not intended to be limited to the examples above and it is certain that various modifications may be made without departing from the spirit and scope of the present invention.

For example, the gate electrode is not to be limited to polysilicon, and the present invention can be implemented by using a silicide gate electrode employing Ti or Co.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A process for producing a semiconductor integrated circuit device, comprising the steps of:
   (a) providing a first insulating film over a semiconductor substrate;
   (b) providing a plurality of wiring grooves in the first insulating film;
   (c) forming a first conductive film on the first insulating film including respective insides of the plurality of the wiring grooves;
   (d) removing the first conductive film lying outside the plurality of the wiring grooves to form a wiring line composed of the first conductive film in respective insides of the plurality of the wiring grooves;
   (e) forming a second insulating film from material different than that of the first insulating film on the first insulating film and the wiring line;
   (f) etching the second insulating film by using a mask covering a formation region of a connection hole to be formed in a later step for exposing the upper surface of the wiring line, to form a sacrifice film pillar composed of the second insulating film in the formation region of the connection hole;
   (g) selectively removing the first insulating film in a region not covered with the sacrifice film pillar to leave behind the first insulating film under the sacrifice film pillar;
   (h) forming a third insulating film from material different than that of the second insulating film on the wiring line and the sacrifice film pillar, while leaving behind an air-gap in a space region between the wiring line portions on which the first insulating film was removed;
   (i) removing the third insulating film on the sacrifice film pillar to expose the upper surface of the sacrifice film pillar;
   (j) removing the sacrifice film pillar to form the connection hole for exposing the upper surface of the wiring line; and
   (k) forming a second conductive film inside the connection hole.

2. The process for producing a semiconductor integrated circuit device according to claim 1, wherein the first insulating film and the third insulating film are formed from the same material.

3. The process for producing a semiconductor integrated circuit device according to claim 2, wherein the first insulating film and the third insulating film are an inorganic insulating film, and the second insulating film is an organic insulating film.

4. The process for producing a semiconductor integrated circuit device according to claim 3, wherein the first insulating film and the third insulating film are an FSG film, and the second insulating film is a SiLK film.

5. The process for producing a semiconductor integrated circuit device according to claim 1, further including a step of forming a SIC film on the wiring line and the sacrifice film pillar between the steps (g) and (h), wherein the third insulating film is a porous SiOC film.

6. The process for producing a semiconductor integrated circuit device according to claim 5, wherein the first insulating film is an FSG film, and the second insulating film is a SiLK film.

7. The process for producing a semiconductor integrated circuit device according to claim 1, wherein the first conductive film is formed from at least any one of metals including Al, Cu, W, Ag and Au.

8. The process for producing a semiconductor integrated circuit device according to claim 1, wherein the second conductive film is formed from at least any one of metals including Al, Cu, W, Ag and Au.

9. The process for producing a semiconductor integrated circuit device according to claim 1, further including a step of forming a metal cap film on the wiring line between the steps (d) and (e), wherein the metal cap film is formed from at least any one of metals and metallic compounds including Co, W, Ni, Cr and Au.

10. The process for producing a semiconductor integrated circuit device according to claim 1, wherein the formation of the third insulating film in the step (h) is performed using a low coverage formation condition during an initial formation step, and after the formation of the air-gap, using a high coverage formation condition.

11. A process for producing a semiconductor integrated circuit device, comprising the steps of:
   (a) providing a first insulating film over a semiconductor substrate;
   (b) removing a part of the first insulating film to form a plurality of first wiring grooves for a first Damascene wiring portion to be formed in a later step;
   (c) forming a first conductive film on the first insulating film including respective insides of the plurality of the first wiring grooves;
   (d) removing the first conductive film lying outside the plurality of the first wiring grooves to form the first Damascene wiring portion composed of the first conductive film in respective insides of the plurality of the first wiring grooves;

(e) forming a second insulating film from material different than that of the first insulating film on the first insulating film and the first Damascene wiring portion;

(f) etching the second insulating film using a mask covering a formation region of a plurality of connection holes to be formed in a later step for a via portion of a second Damascene wiring portion to form a plurality of sacrifice film pillars composed of the second insulating film in the formation region of the plurality of the connection holes;

(g) selectively removing the first insulating film in a region not covered with the sacrifice film pillars to leave behind the first insulating film under the sacrifice film pillars;

(h) forming a third insulating film from material different than that of the second insulating film on the wiring portion and the sacrifice film pillars, while leaving behind an air-gap in a space region between the wiring portions on which the first insulating film was removed;

(i) removing the third insulating film on the sacrifice film pillars to expose the upper surface of the plurality of the sacrifice film pillars;

(j) removing a part of the third insulating film and the top of the plurality of the sacrifice film pillars to form a plurality of second wiring grooves for wiring of the second Damascene wiring portion to be formed in a later step;

(k) removing the bottom of the plurality of the sacrifice film pillars to form the plurality of the connection holes;

(l) forming a second conductive film on the third insulating film including respective insides of the plurality of the second wiring grooves and the plurality of the connection holes; and (m) removing the second conductive film lying outside the plurality of the second wiring grooves and the plurality of the connection holes to form the second Damascene wiring portion composed of the second conductive film in respective insides of the plurality of the second wiring grooves and the plurality of the connection holes.

12. The process for producing a semiconductor integrated circuit device according to claim 11, wherein the first insulating film and the third insulating film are formed from the same material.

13. The process for producing a semiconductor integrated circuit device according to claim 12, wherein the first insulating film and the third insulating film are an inorganic insulating film, and the second insulating film is an organic insulating film.

14. The process for producing a semiconductor integrated circuit device according to claim 13, wherein the first insulating film and the third insulating film are an FSG film, and the second insulating film is a SiLK film.

15. The process for producing a semiconductor integrated circuit device according to claim 11, wherein the first conductive film and the second conductive film are formed from at least any one of metals including Al, Cu, W, Ag and Au.

16. The process for producing a semiconductor integrated circuit device according to claim 11, further including a step of forming a metal cap film on the first Damascene wiring portion and the second Damascene wiring portion between the steps (d) and (g) and after the step (m), wherein the metal cap film is formed from at least any one of metals and metallic compounds including Co, W, Ni, Cr and Au.

17. The process for producing a semiconductor integrated circuit device according to claim 11, wherein the formation of the third insulating film in the step (h) is performed using a low coverage formation condition during an initial formation step, and after the formation of the air-gap, using a high coverage formation condition.

18. The process for producing a semiconductor integrated circuit device according to claim 11, wherein the formation of the plurality of the second wiring grooves in the step (i) is performed by removing a part of the third insulating film after removing the top of the plurality of the sacrifice film pillars.

19. The process for producing a semiconductor integrated circuit device according to claim 11, wherein the formation of the plurality of the second wiring grooves in the step (i) is performed by using a hard mask composed of a fourth insulating film.

20. The process for producing a semiconductor integrated circuit device according to claim 19, wherein the fourth insulating film is a SiN film.

* * * * *